US010057795B2

(12) United States Patent
Starzer et al.

(10) Patent No.: US 10,057,795 B2
(45) Date of Patent: Aug. 21, 2018

(54) RF RECEIVER WITH BUILT-IN SELF-TEST FUNCTION

(71) Applicant: Infineon Technologies AG, Neubiberg (DE)

(72) Inventors: Florian Starzer, Ennsdorf bei Enns (AT); Peter Bogner, Wernberg (AT); Oliver Frank, Linz (AT); Guenter Haider, Linz (AT); Michael Kropfitsch, Koettmannsdorf (AT); Thomas Sailer, Zwettl a.d. Rodl (AT); Jochen O. Schrattenecker, Reichenthal (AT); Rainer Stuhlberger, Puchenau (AT)

(73) Assignee: Infineon Technologies AG, Neubiberg (DE)

( * ) Notice: Subject to any disclaimer, the term of this patent is extended or adjusted under 35 U.S.C. 154(b) by 7 days.

(21) Appl. No.: 15/610,840

(22) Filed: Jun. 1, 2017

(65) Prior Publication Data

US 2017/0353876 A1 Dec. 7, 2017

(30) Foreign Application Priority Data

Jun. 3, 2016 (DE) .......................... 10 2016 110 344

(51) Int. Cl.
| | |
|---|---|
| *H04B 3/46* | (2015.01) |
| *H04B 17/00* | (2015.01) |
| *H04Q 1/20* | (2006.01) |
| *H04W 24/06* | (2009.01) |
| *H04B 1/16* | (2006.01) |
| *H03F 3/195* | (2006.01) |
| *H03M 1/12* | (2006.01) |

(52) U.S. Cl.
CPC .............. *H04W 24/06* (2013.01); *H04B 1/16* (2013.01); *H03F 3/195* (2013.01); *H03F 2200/165* (2013.01); *H03F 2200/333* (2013.01); *H03F 2200/451* (2013.01); *H03M 1/1245* (2013.01)

(58) Field of Classification Search
CPC ... H04L 1/205; H04L 1/206; G01R 31/31709; G01R 29/26; H04B 3/462
USPC .................................................. 375/219–228
See application file for complete search history.

(56) References Cited

U.S. PATENT DOCUMENTS

| | | | | |
|---|---|---|---|---|
| 6,118,811 A * | 9/2000 | Narumi | .................... | H04B 1/40 375/219 |
| 6,539,066 B1* | 3/2003 | Heinen | .................. | H03D 3/008 375/316 |

(Continued)

FOREIGN PATENT DOCUMENTS

DE 10 2015 115 017 A1 3/2016

*Primary Examiner* — James M Perez
(74) *Attorney, Agent, or Firm* — Volpe and Koenig, P.C.

(57) ABSTRACT

A radio frequency (RF) receive circuit is described herein. In accordance with one embodiment, the RF receive circuit includes a mixer configured to receive an RF input signal to down-convert the RF input signal into a base-band or intermediate frequency (IF) band, an analog-to-digital converter (ADC), and a signal processing chain coupled between the mixer and the ADC. The signal processing chain includes at least two circuit nodes. The RF receive circuit further includes an oscillator circuit that is configured to generate a test signal. The oscillator circuit is coupled to the signal processing chain and is configured to selectively feed the oscillator signal into one of the at least two circuit nodes.

22 Claims, 6 Drawing Sheets

(56) References Cited

U.S. PATENT DOCUMENTS

| | | | |
|---|---|---|---|
| 6,845,126 B2* | 1/2005 | Dent | H03F 3/24 375/219 |
| 7,130,359 B2* | 10/2006 | Rahman | H03D 3/008 375/316 |
| 7,203,472 B2* | 4/2007 | Seppinen | H04B 17/20 375/224 |
| 7,248,625 B2* | 7/2007 | Chien | H04B 1/30 375/219 |
| 7,299,006 B1* | 11/2007 | Rofougaran | H03D 3/244 323/267 |
| 7,315,215 B2* | 1/2008 | Cafaro | H03H 11/265 327/158 |
| 7,539,268 B2* | 5/2009 | Fechtel | H03D 3/008 375/213 |
| 7,672,364 B2* | 3/2010 | Kang | H04L 27/364 375/219 |
| 7,782,928 B2* | 8/2010 | Kang | H03D 3/008 375/219 |
| 7,826,549 B1* | 11/2010 | Aggarwal | H03C 1/60 332/170 |
| 7,856,048 B1* | 12/2010 | Smaini | H04B 1/40 330/2 |
| 7,856,050 B1* | 12/2010 | Wiss | H04B 17/0085 375/224 |
| 8,306,157 B2* | 11/2012 | Seendripu | H03D 3/008 375/299 |
| 8,340,167 B2* | 12/2012 | Feng | H04B 17/21 375/226 |
| 8,411,730 B2* | 4/2013 | Maeda | H04B 17/0085 375/146 |
| 8,422,540 B1* | 4/2013 | Negus | H04B 1/38 370/210 |
| 8,750,416 B2* | 6/2014 | Lindemann | H04L 25/03343 330/149 |
| 8,897,350 B2* | 11/2014 | Mouri | H04L 27/2275 375/226 |
| 8,923,370 B2* | 12/2014 | Johansson | H04B 1/0007 375/219 |
| 8,989,307 B2* | 3/2015 | Zhou | H03F 1/3247 330/291 |
| 9,042,855 B1* | 5/2015 | Ottini | H03D 7/1483 455/295 |
| 9,203,448 B2* | 12/2015 | Morita | H04B 1/0475 |
| 9,276,798 B2* | 3/2016 | Yu | H04L 27/364 |
| 9,341,503 B2* | 5/2016 | Zhuge | G01D 9/005 |
| 9,485,036 B2* | 11/2016 | Kordik | H04B 17/0085 |
| 9,667,357 B2* | 5/2017 | Knapp | H04B 17/102 |
| 2003/0169827 A1* | 9/2003 | Shi | H04B 1/406 375/295 |
| 2003/0206603 A1* | 11/2003 | Husted | H04L 27/3863 375/324 |
| 2004/0106380 A1* | 6/2004 | Vassiliou | H04B 17/14 455/73 |
| 2005/0047384 A1* | 3/2005 | Wax | H04W 72/046 370/338 |
| 2006/0009180 A1* | 1/2006 | Xu | H04B 1/0039 455/226.1 |
| 2006/0034356 A1* | 2/2006 | Fechtel | H03D 3/008 375/219 |
| 2006/0223457 A1* | 10/2006 | Rahman | H04B 1/0475 455/78 |
| 2007/0047634 A1* | 3/2007 | Kang | H03D 3/008 375/226 |
| 2007/0123188 A1* | 5/2007 | Mo | H03D 3/009 455/302 |
| 2008/0045162 A1* | 2/2008 | Rofougaran | H03D 3/244 455/73 |
| 2010/0026906 A1* | 2/2010 | Okanobu | H03G 3/3068 348/731 |
| 2010/0085109 A1* | 4/2010 | Okanobu | H03K 17/162 327/534 |
| 2010/0093282 A1* | 4/2010 | Martikkala | H04B 17/14 455/63.4 |
| 2011/0026570 A1* | 2/2011 | Feng | H04B 17/21 375/224 |
| 2012/0264391 A1* | 10/2012 | Basaran | H03D 7/1441 455/341 |
| 2013/0137381 A1* | 5/2013 | Vassiliou | H04L 5/143 455/67.15 |
| 2013/0201050 A1* | 8/2013 | Hellsten | G01S 7/006 342/21 |
| 2014/0036973 A1* | 2/2014 | Au | H03F 1/3247 375/221 |
| 2014/0134943 A1* | 5/2014 | Hobbs | H04B 7/15535 455/9 |
| 2014/0148112 A1* | 5/2014 | Sundstrom | H04B 3/46 455/226.1 |
| 2014/0204986 A1* | 7/2014 | Suissa | H04L 27/0014 375/219 |
| 2014/0269863 A1* | 9/2014 | Fan | H04B 1/525 375/221 |
| 2014/0306688 A1* | 10/2014 | Crooks | G01R 23/16 324/76.23 |
| 2014/0355655 A1* | 12/2014 | Chakraborty | H04B 1/40 375/219 |
| 2015/0288467 A1* | 10/2015 | Kahrizi | H04B 17/21 370/241 |
| 2016/0087734 A1* | 3/2016 | Kordik | H04B 17/0085 455/67.14 |
| 2017/0082756 A1* | 3/2017 | Parikh | G01S 19/37 |
| 2017/0179999 A1* | 6/2017 | Vassiliou | H04B 1/56 |
| 2017/0187414 A1* | 6/2017 | Talty | H04B 1/40 |
| 2017/0195961 A1* | 7/2017 | Chakraborty | H04W 52/0229 |
| 2017/0353876 A1* | 12/2017 | Starzer | H04W 24/06 |
| 2018/0003754 A1* | 1/2018 | Schrattenecker | G01R 29/10 |
| 2018/0062768 A1* | 3/2018 | Frank | H04B 17/0085 |

\* cited by examiner

RF RECEIVER WITH BUILT-IN SELF-TEST FUNCTION

FIELD

The present disclosure relates to the field of radio frequency (RF) transceiver or receiver circuits, particularly to an RF transceiver or receiver chip with built-in self-testing functions.

BACKGROUND

Radio frequency (RF) transceivers and receivers can be found in numerous applications, particularly in the field of wireless communications and radar sensors. In the automotive sector, there is an increasing demand for radar sensors used in so-called "adaptive cruise control" (ACC) or "radar cruise control" (RCC) systems. Such systems may be used, for example, to automatically adjust the speed of an automobile so as to maintain a safe distance from other automobiles or other objects ahead.

Modern radar systems make use of highly integrated RF circuits, which may incorporate all core functions of an RF font-end of a radar transceiver in one single package (single chip transceiver). Such RF front-ends may include, inter alia, a voltage controlled oscillator (VCO), amplifiers such as power amplifiers and low noise amplifiers (LNAs), mixers, and analog-to-digital converters (ADC). Furthermore, the single chip transceiver may include a digital signal processor for digital post-processing of the received signal.

Radar applications used in automobiles are subject to various standards concerning road traffic safety, for example the functional safety standard ISO 26262 titled "Road vehicles—Functional safety". To ensure the functional safety of a radar sensor, it is important to know whether the current state of the radar sensor allows a reliable distance and speed measurement. However, also in applications other than radar, reliability may be an issue.

Thus there is a need for RF transceivers or receivers having improved self-test capability to increase the reliability of the overall system.

SUMMARY

A radio frequency (RF) receive circuit is described herein. In accordance with one exemplary embodiment, the RF receive circuit includes a mixer configured to receive an RF input signal to down-convert the RF input signal into a base-band or intermediate frequency (IF) band, an analog-to-digital converter (ADC), and a signal processing chain coupled between the mixer and the ADC. The signal processing chain includes at least two circuit nodes. The RF receive circuit further includes an oscillator circuit that is configured to generate a test signal. The oscillator circuit is coupled to the signal processing chain and is configured to selectively feed the oscillator signal into one of the at least two circuit nodes.

Furthermore, a method for testing an RF receive circuit is described herein, wherein the RF receive circuit includes a signal processing chain coupled between a mixer and an ADC. In accordance with one exemplary embodiment, the method includes selecting, based on a first selection signal, a first circuit node of at least three circuit nodes of the signal processing chain; feeding a test signal into the selected first circuit node; selecting, based on a second selection signal, a second circuit node of at least three circuit nodes of the signal processing chain; and connecting the selected second circuit node with a test pad or an output pin of the RF receive circuit.

Moreover, a system for testing an RF receive circuit is described. In accordance with one exemplary embodiment the system includes automatic test equipment (ATE) and an RF receive circuit coupled to the ATE during a test. The RF receive circuit includes a mixer, which is configured to receive an RF input signal and to down-convert the RF input signal into a base-band or intermediate frequency (IF) band. The RF receive circuit further includes an ADC and a signal processing chain coupled between the mixer and the ADC. The signal processing chain includes at least two circuit nodes, and an oscillator circuit configured to generate a test signal, wherein the oscillator circuit is coupled to the signal processing chain and configured to selectively feed the oscillator signal into one of the at least two circuit nodes. The ATE is configured to cause the oscillator circuit to feed the oscillator signal into a selected one of the at least two circuit nodes.

Further, a radar sensor is described herein. In accordance with one exemplary embodiment, the radar sensor includes at least one antenna providing an RF antenna signal, an RF receive circuit coupled to the at least one antenna, and a digital signal processor receiving a digital output signal. The RF receive circuit includes a mixer configured to receive an RF input signal, which represents the RF antenna signal, and to down-convert the RF input signal into a base-band or intermediate frequency (IF) band. The RF receive circuit further includes an ADC providing the digital output signal, and a signal processing chain coupled between the mixer and the ADC. The signal processing chain includes at least two circuit nodes. Further, the RF receive circuit includes an oscillator circuit that is configured to generate a test signal, is coupled to the signal processing chain, and is configured to selectively feed the test signal into one of the at least two circuit nodes. During a self-test of the radar sensor, the digital signal processor is configured to select a circuit node of the at least two circuit nodes, thus causing the oscillator circuit to feed the test signal into the selected circuit node and further causing the ADC to generate the digital output signal in response to the test signal. Further, the digital signal processor is configured to perform a spectral analysis of the output signal to obtain a digital spectral representation of the digital output signal.

BRIEF DESCRIPTION OF THE DRAWINGS

The invention can be better understood with reference to the following drawings and descriptions. The components in the figures are not necessarily to scale; in-stead emphasis is placed upon illustrating the principles of the invention. Further, in the figures, like reference numerals designate corresponding parts. In the drawings.

DETAILED DESCRIPTION

Embodiments of the present invention are discussed below in the context of a radar transceiver. It should be noted, however, that the present invention may also be applied in applications other than radar such as, for example, radio frequency (RF) transceivers of RF communication devices.

A so-called "single chip radar" may include circuitry providing the core RF functions needed for distance and/or velocity measurement in one chip. Thus, the chip may include, inter alia, RF front-end circuitry such as RF oscillators, amplifiers, and mixers, and base band (or intermediate frequency (IF) band) circuitry such as amplifiers and analog filters. Additionally, an analog-to-digital converter may be included in the chip to digitize the base-band or IF-band signal. In future sensor designs, a digital signal processor may also be included in the chip together with the ADC, the base-band circuitry and the RF frontend circuitry. However, in today's radar sensors, a signal processor is usually implemented in a separate chip.

Figure 1:
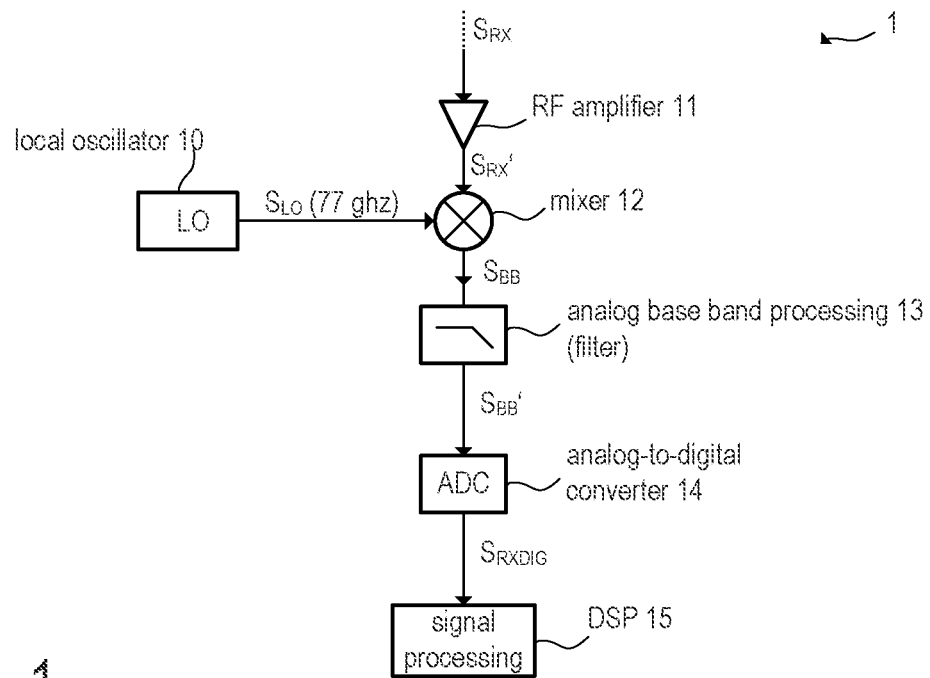
FIG. 1 is a block diagram illustrating the basic structure of the receive path of a RF transceiver chip.

FIG. 1 illustrates the receive path (receive channel) of an RF transceiver 1 (or an RF receiver) as used, for example, in a radar distance measurement device. In accordance with the present example, the receive path 1 includes a mixer 12, which is supplied with an RF input signal $S_{RX}$ and an RF oscillator signal $S_{LO}$ (mixer reference signal), which is used to down-convert the RF input signal $S_{RX}$ into the base band or an IF-band. The RF input signal $S_{RX}$ may be provided by an antenna (not shown in FIG. 1) and may be pre-amplified before being supplied to the mixer 12. In the present example, the amplified RF input signal $S_{RX}'$ is provided by the RF amplifier 11, and the RF oscillator signal $S_{LO}$ is generated by a local oscillator (LO) 10, which may include, for example, a voltage controlled oscillator (VCO) coupled in a phase locked loop (PLL). However, the RF oscillator signal $S_{LO}$ may be provided by other circuitry dependent on the actual application. When used in a radar distance measurement device, the RF oscillator signal $S_{LO}$ may be in the range between approximately 24 GHz and 81 GHz (usually approximately 77 GHz). However, higher or lower frequencies may also be applicable. If a so-called frequency-modulated continuous-wave (FMCW) radar sensor is used, the RF oscillator signal $S_{LO}$ is usually frequency-modulated. The operating principle of an FMCW radar is, however, as such known and thus not further discussed herein.

One or more antennas and, as mentioned above, digital signal processor cores may be included in the same chip package as the RF front-end (RF circuitry and mixers) and the base-band signal-processing chain. As practically the whole radar distance measurement system is integrated in a single chip-package, the system is also referred to as system-in-a-package (SiP). However, the ADC and the digital part of the system (which is usually manufactured using CMOS technology) may also be arranged in one or more separate chips. Similarly, the antenna may be arranged in a separate package. In some embodiments, so-called Embedded Wafer Level Ball Grid Array (eWLB) packages are used for packaging the RF and base-band circuitry as well as the antenna(s).

As mentioned, the mixer 12 down-converts the RF input signal $S_{RX}'$ (amplified antenna signal) into the base band. The respective base band signal (mixer output signal) is denoted by $S_{BB}$. The down-conversion may be accomplished in a single stage (i.e. from the RF band into the base band) or in one or more intermediate stages (from the RF band into an IF band and subsequently into the base band). The base band signal $S_{BB}$ is then subject to analog base band signals processing provided, for example, by the signal processing chain 13. The signal processing chain 13 includes at least one analog filter to suppress undesired sidebands or image frequencies. The signal processing chain 13 may include at least one of the following components: a low-pass filter, a high pass filter, and a base band amplifier. The filtered base band signal (output signal of the signal processing chain 13) is denoted by $S_{BB}'$. Receivers that make use of a mixer to down-convert the RF input signal into the base band are as such known as heterodyne receivers and thus not further discussed in more detail. The filtered base band signal $S_{BB}'$ is then sampled and converted to a digital signal $S_{RXDIG}$ (analog-to-digital converter 14), which is then further processed in the digital domain using, for example, a signal processor 15. In the case of a down-conversion into an IF band instead of the base band, the IF signal may also be processed in the same manner as the base band signal in the present example and subsequently digitized for a digital demodulation of the IF signal and further digital processing. The digital signal processing may be performed using, e.g., a digital signal processor (DSP) executing appropriate software instructions. For this purpose, one or more processor cores may be integrated in the same chip as analog signal processing chain 13.

Figure 2:
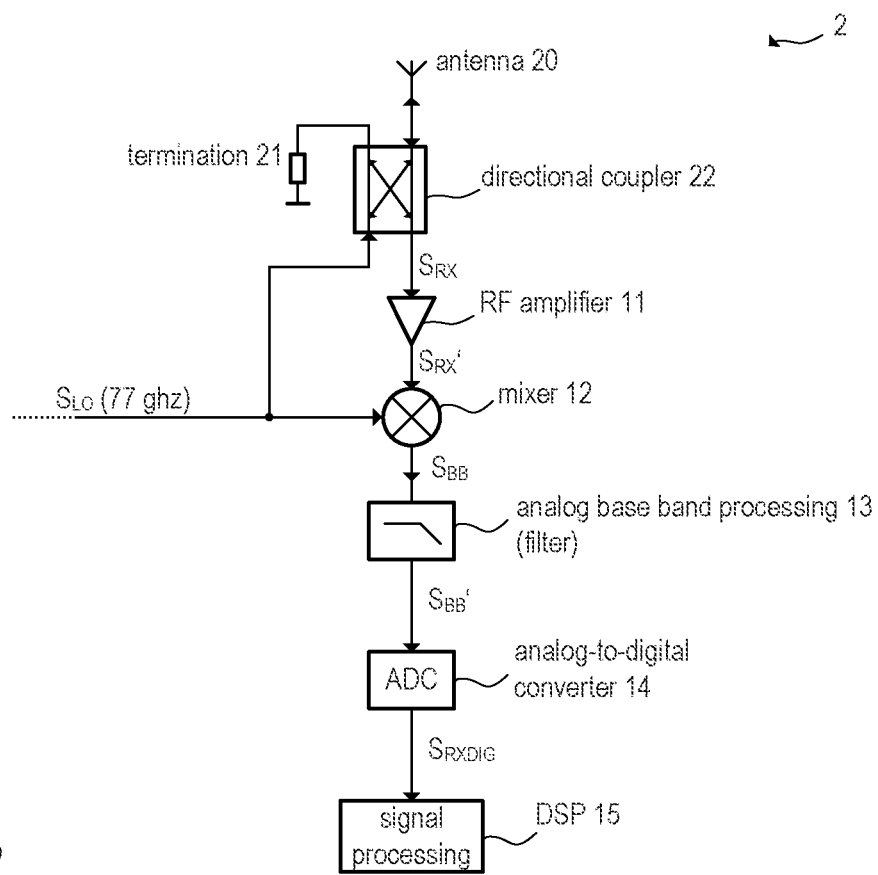
FIG. 2 is a block diagram illustrating the receive/transmit path in a monostatic radar transceiver chip.

FIG. 1 illustrates the receive path of an RF receiver or transceiver. In so-called bistatic or pseudo-monostatic radar systems the receiver may be separate from the transmitter as receiver and transmitter use separate antennas. FIG. 2 illustrates a RF transceiver (combined receiver and transmitter), which may be used in a monostatic radar system in which the same antenna is used to transmit and receive RF signals. The transceiver of FIG. 2 includes a directional coupler 22 which is coupled between a mixer 10 and an antenna 20 and configured to direct the RF signal $S_{RX}$ received by the antenna 20 to the mixer 12 (receive path). Further, the directional coupler 22 is configured to direct the RF oscillator signal $S_{LO}$ (e.g. provided by a local oscillator 10, not shown in FIG. 2) to the antenna 20, which radiates a respective electromagnetic radar signal. Besides the directional coupler 22, the receive path downstream of the directional coupler 22 (amplifier 11, mixer 12, analog base band signal processing chain 13, analog-to-digital converter 14, digital signal processor 15) is the same as in FIG. 1 and thus not repeated here.

The directional coupler 22 may be, for example, implemented as a rat-race coupler formed by strip lines. However, other types of directional couplers, such as a circulator, may be used. Particularly when using a rat race coupler, one port of the coupler is terminated by a termination impedance 21. The directional coupler 22 may be implemented in the same chip package as the other circuit components of the transceiver to provide a single chip solution. The termination impedance 21 matches the characteristic impedance of the directional coupler to avoid undesired reflections at the terminated port.

Figure 3:
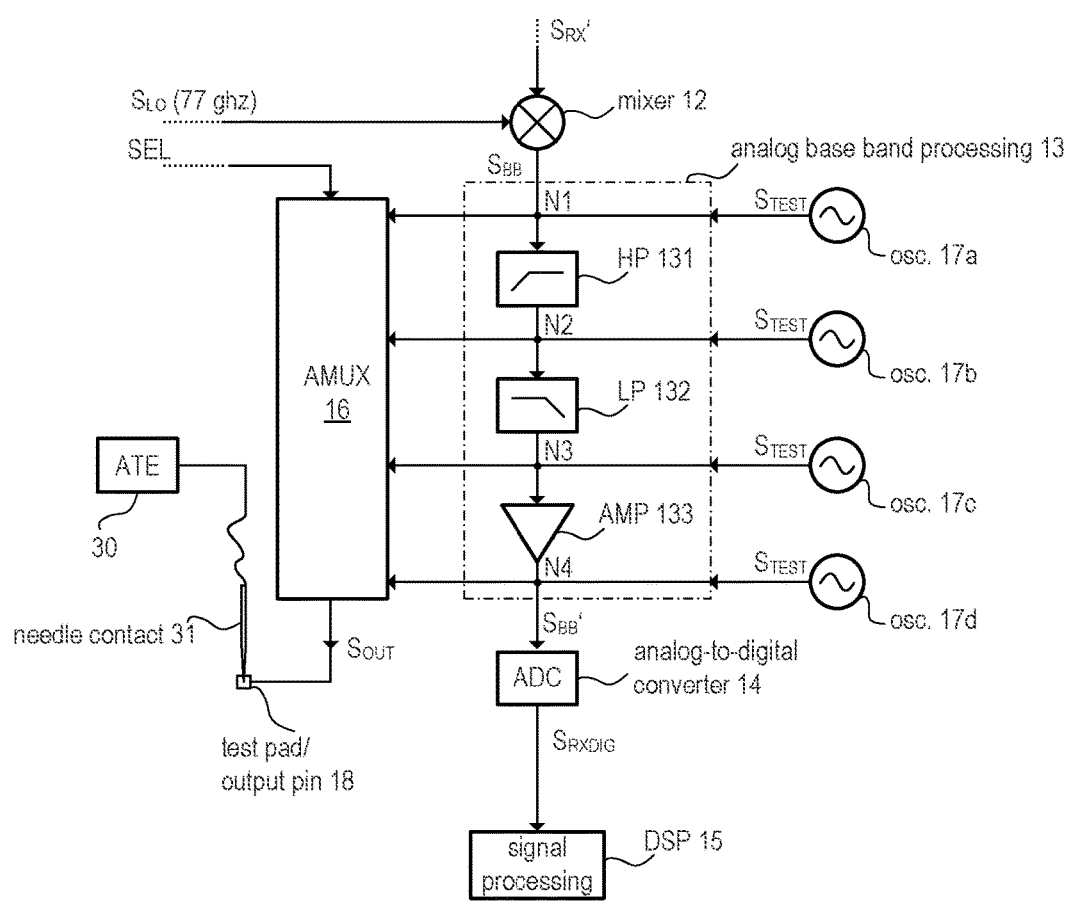
FIG. 3 is a block diagram illustrating a first exemplary embodiment of a base band signal processing chain of a radar receiver channel including oscillators for use during production tests.

FIG. 3 is a block diagram illustrating one exemplary implementation of the base-band signal processing chain 13 (see FIG. 1) and related circuitry in more detail. In the present example, the base-band signal processing chain 13 includes a high-pass filter 131, a low-pass filter 132, and a base-band amplifier 133, which are connected in series as shown in FIG. 3. Accordingly, the down-converted RF signal (output signal of mixer 12) $S_{BB}$ is high-pass filtered, subsequently low-pass filtered and finally amplified. The series connection of high-pass filter 131 and low-pass filter 132 essentially forms a band-pass filter. An additional amplifier may be arranged between mixer 12 and high-pass 131. The circuit components 131, 132 and 133 in the base-band signal processing chain 13 may be arranged in a different order if necessary or desirable for a specific application. The processed (filtered and amplified) base band signal $S_{BB}'$ is supplied to the analog-to-digital converter, which is configured to digitize the signal $S_{BB}'$. The resulting digital base-band signal $S_{RXDIG}$ may then be further processed using a digital signal processor (e.g. DSP 15).

The inputs and outputs of the circuit components 131, 132 and 133 are connected to the inputs of an analog multiplexer (AMUX) 16. In the present example, the circuit node (node N1) at the input of the high pass filter 131, the common circuit node (node N2) between high pass filter 131 and low pass filter 132, the common circuit node (node N3) between low pass filter 132 and amplifier 133, as well as the circuit node (node N4) at the output of the amplifier 133 are connected to the analog multiplexer 16. The analog multiplexer 16 receives a selection signal SEL and is configured to feed through the signal, which is present at a selected one of the inputs of the analog multiplexer 16, to the output of the analog multiplexer 16. The output of the analog multiplexer 16 may be connected with a test pad or an output pin 18 of the semiconductor chip, in which the base band signal processing chain 13 is integrated. Not all of the circuit nodes N1, N2, N3, and N4 necessarily have to be connected to the multiplexer inputs. In some examples, only two or three of these circuit nodes are connected to the analog multiplexer 16.

The selection signal SEL may be a digital signal provided by a control circuit (not shown). In one specific example, the selection signal may be a two-bit signal, which may assume one of the values 00, 01, 10, 11. Accordingly, the output signal of the mixer 12 may be fed through by the analog multiplexer 16, when SEL=00. The output signal of the high-pass filter 131 may be fed through by the analog multiplexer 16, when SEL=01. The output signal of the high-pass filter 131 may be fed through by the analog multiplexer 16, when SEL=01. The output signal of the low-pass filter 132 may be fed through by the analog multiplexer 16, when SEL=10, and the output signal of the amplifier 133 may be fed through by the analog multiplexer 16, when SEL=11. It is noted that more than the four circuit nodes shown in FIG. 3 may be connected to the test pad/output pin 18 in more than four components arranged in the base band signal processing chain 13.

In accordance with the present example, test signals $S_{TEST}$ can be injected at the circuit nodes N1, N2, N3, and N4 for testing the individual circuit components arranged in the base-band signal processing chain 13. Oscillators 17a, 17b, 17c, and 17d, which may be integrated in the same chip as the base-band signal processing chain 13, are connected to the circuit nodes N1, N2, N3, and N4, respectively, and configured to generate the test signals $S_{TEST}$. In the present example, the test signals $S_{TEST}$ generated by the oscillators 17a, 17b, 17c, and 17d are the same. However, this is not necessarily the case and different test signals may be used in other embodiments. One exemplary implementation of an oscillator and one exemplary waveform of a test signal will be described further below. However, it is noted that in the present example, the test signals $S_{TEST}$ are broadband signals and not single-frequency signals. In one example, the test signals $S_{TEST}$ are rectangular signals. The oscillators 17a, 17b, 17c, and 17d may be configured to be individually enabled and disabled.

The circuit arrangement including the oscillators 17a, 17b, 17c, 17d, the base-band signal processing chain 13 and the analog multiplexer 16 allows for an improved production test (end-of-line test, EOL test), in which external automatic test equipment (ATE) 30 is connected to the test pad/output pin 18 in order to receive the signal present at a particular one of the circuit nodes N1, N2, N3, and N4. In FIG. 3, the signal at the test pad/output pin 18 is denoted as $S_{OUT}$. Usually the test pad/output pin 18 is connected to the ATE 30 using a needle contact 31 or a similar contact such as a pogo pin (spring loaded pin) or the like.

To test, for example, the frequency response of the high-pass filter 131, oscillator 17a is enabled and produces, for example, a rectangular signal, which is supplied to the input of the high-pass filter 131. Further, the analog multiplexer 16 is configured to select the input connected to circuit node N2. Thus, the output signal of the high pass filter 131 is fed through the analog multiplexer 16 and is provided, as signal SOUT, at test pad/output pin 18, where the signal is tapped by the ATE 30. The ATE may be configured to perform a spectrum analysis (e.g. spectral estimation) of the output signal of the high pass filter 131 and compare the resulting spectrum (e.g. magnitude and frequency values) with a stored reference spectrum. Based on this comparison, the high-pass filter 131 is assessed as good or defective. The same can be done for the low-pass filter 132. In this case, oscillator 17b is enabled to provide a test signal STEST as stimulus to the input of the low-pass filter 132, while the analog multiplexer 16 is configured to feed through the low-pass output signal present at circuit node N3. Similarly, the amplifier 133 can be tested. In this case, oscillator 17c is enabled to provide a test signal STEST as stimulus to the input of the amplifier 133, while the analog multiplexer 16 is configured to feed through the amplifier output signal SBB' present at circuit node N4.

It should be noted that a passive circuit component (e.g., the low-pass filter 132) may be implemented using only passive circuit elements such as resistors and capacitors and/or inductors and may be tested by feeding the test signal STEST to the circuit node at the circuit component's output (e.g. node N3 at the output of the low-pass filter 132), while tapping the resulting output signal at the circuit component's input (e.g. node N2 at the input of the low-pass filter 132). In the present example, oscillator 17c may be activated to apply the test signal to the output of the low-pass filter 132 (node N3) and the multiplexer 16 may be configured to connect the input of the low-pass filter 132 (node N2) to the test pad/output pin 18. If more than two test-pads/output pins are available, two circuit components could be tested at the same time. For example, when applying the test signal STEST at circuit node N2, both the high-pass filter 131 and the low-pass filter 132 can be tested by tapping the high-pass filter's response signal at circuit node N1 and the low-pass filter's response signal at the circuit node N3.

Further tests can be made to test a series circuit of two or more components in one step. For example, oscillator 17a can be enabled to provide a test signal STEST as stimulus to the input of the high-pass filter 131, while the analog multiplexer 16 is configured to feed through the output signal of the low-pass filter 132 present at circuit node N3. In this case the spectrum analysis performed in the ATE 30 will represent the combined transfer characteristics of both, the high-pass filter 131 and the low-pass filter 132.

The herein proposed approach for testing circuit components of the base-band signal processing chain 13 allows for testing each individual circuit component separately. Furthermore, this approach allows for more reliable tests because, in practice, the parameters of the test signal STEST (which is a base band signal and not an RF signal) can be better controlled when the test signal is generated in the base band frequency domain as compared with the test signal being generated in the RF frequency range and subsequently down-converted by the mixer. It is noted that, although FIG. 3 shows four oscillators 17a, 17b, 17c, and 17d, this is not necessarily the case. For example, oscillator 17d may be omitted if desired in a specific application. However, oscillator 17d allows for a direct testing of the ADC 14, as will be explained further below with reference to FIG. 4.

Figure 4:
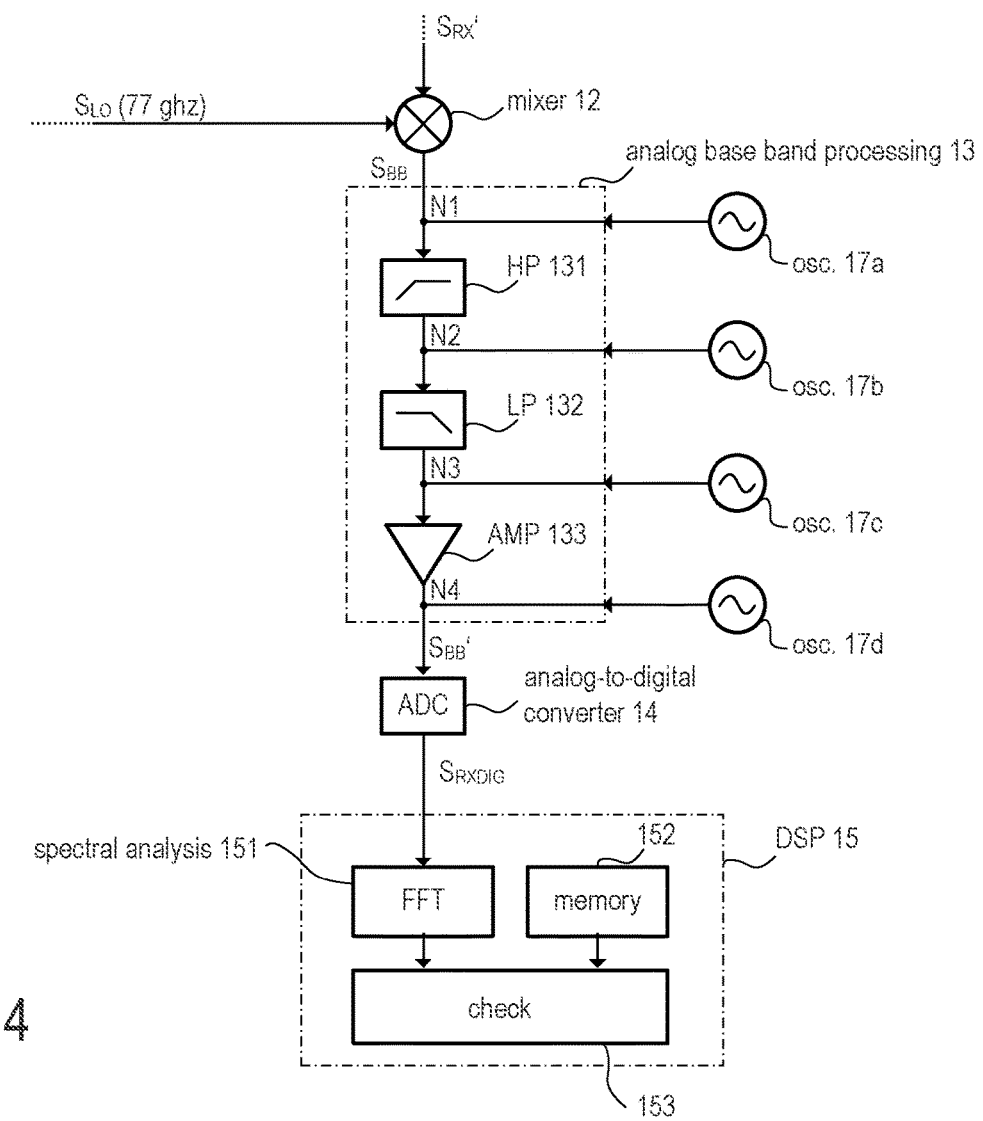
FIG. 4 is a block diagram illustrating a second exemplary embodiment of a base band signal processing chain of a radar receiver channel including oscillators for use during self-tests that are regularly performed during operation.

FIG. 4 is a block diagram illustrating another exemplary implementation of the base-band signal processing chain 13 (see FIG. 1) and related circuitry used for testing the base-band signal processing chain 13 and the ADC 14 connected downstream of the base-band signal processing chain 13. The circuit of FIG. 4 is essentially the same as the previous example of FIG. 4. However, the analog-multiplexer has been omitted as the following explanations concentrate on a built-in self-test mechanism, which may be used for monitoring and testing the RF receiver/transceiver during its lifetime (instead of EOL test) to verify the circuits operability (provides ISO26262 conformity). Furthermore, FIG. 4 illustrates some aspects of the digital signal processing (e.g. performed in DSP 15) in more detail. The circuit components included in the base-band signal processing chain 13 and the oscillators 17a to 17d are the same as in the previous example and reference is thus made to the corresponding description above.

As mentioned, the present embodiment provides a built-in self-test capability, which allows to regularly (i.e. in fixed time intervals, at the occurrence of specific events or from time to time) check the ADC 14 and the circuit components of the base-band signal processing chain 13 for compliance with pre-defined specifications. A self-test can be, for example, initiated at least once during start-up of the radar device. Different from the previous example, the spectral analysis is not performed in an external ATE but rather by the digital signal processor 15 within the radar device.

To test the ADC 14, oscillator 17d is enabled while the other oscillators (17a, 17b and 17c are disabled. Accordingly, the test signal STEST is fed into circuit node N4 and thus directly to the input of the ADC 14. As mentioned above, the test signal STEST may be a broadband signal (e.g. a rectangular signal) to provide a substantial stimulus throughout the whole base-band frequency range. The digital signal processor 15 is configured to perform a spectral analysis (functional block 151), in which a Fast Fourier Transform (FFT) algorithm may be applied to the digitized signal SRXDIG, which is the digital representation of the test signal STEST. The resulting spectrum (e.g. magnitude and frequency values) is compared with a reference spectrum that may be stored in a memory 152 in order to check (functional block 153), based on this comparison, whether the ADC 14 is defective or operates as desired. Particularly when the ADC 14 has a poor linearity, the resulting signal spectrum of the test signal will be distorted.

In another test, oscillators 17a, 17b, and 17d are disabled and oscillator 17c is enabled to feed the test signal STEST into circuit node N3, i.e. to the input of the amplifier 133. In this case the spectrum analysis performed in the DSP 15 (function block 151) will represent the combined transfer characteristics of both the amplifier 133 and the ADC 14. In a further test, oscillators 17a, 17c, and 17d are disabled and oscillator 17b is enabled to feed the test signal STEST into circuit node N2, i.e. to the input of the low-pass filter 132. In this case the spectrum analysis performed in the DSP 15 (function block 151) will represent the combined transfer characteristics of all three, the low-pass filter 132, the amplifier 133, and the ADC 14. Finally, oscillator 17a may be enabled to feed the test signal STEST into circuit node N1 (i.e. to the input of the high-pass filter 131) while the remaining oscillators 17b, 17c, and 17d are disabled. In this case the spectrum analysis performed in the DSP 15 (function block 151) will represent the overall transfer characteristics of the whole base-band signal processing chain 13. Dedicated reference spectra may be stored in the memory 152 for each specific test. If a test fails, the whole radar device may produce unreliable measurements and an error could be signaled or relayed to a superordinate controller unit. In an automotive application, the error signal may be, for example, relayed to a dashboard control unit and a warning (e.g. optical and/or acoustical) may be output to the driver. Additionally or alternatively, other safety mechanisms may be triggered by such an error signal.

The above-described approach, in which a test signal is generated in the base-band frequency range, may provide better results as compared with an approach in which the test signal is generated in the RF frequency range and subsequently down-converted by mixer 12. In the latter approach, imperfections of the mixer 12 may deteriorate the test and, moreover, testing only part of the base-band signal processing chain 13 would not be possible. The test-signal in the base-band may include frequencies of a few kHz up to a few MHz (e.g. 1 kHz to 10 MHz), whereas the RF band includes frequencies around 77 GHz. The exact values may, however, depend on the specific implementation of the radar sensor system. In any case, the base band signal frequencies are at least three orders of magnitude (factor $10^3$) lower than the RF signal frequencies.

Figure 5:
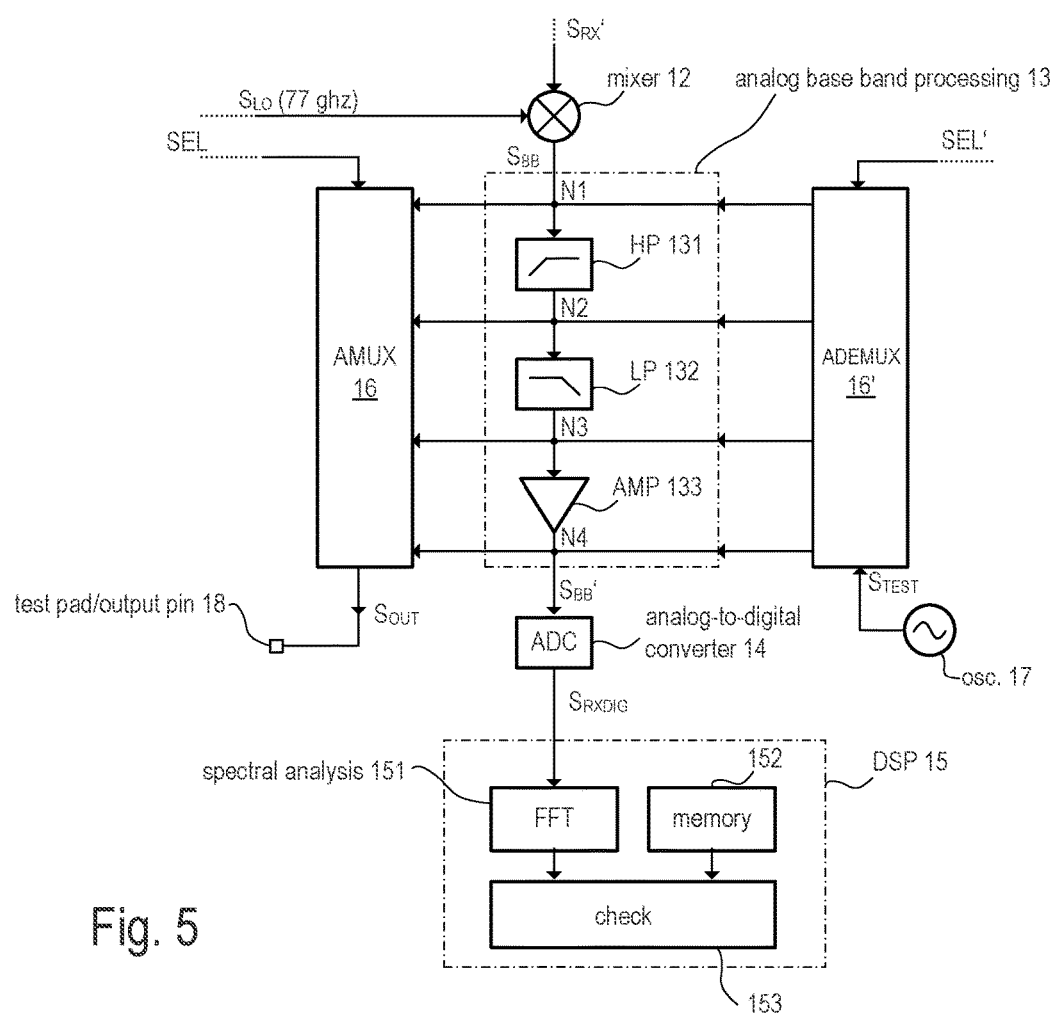
FIG. 5 is a block diagram illustrating a third exemplary embodiment of a base band signal processing chain of a radar receiver channel including an oscillator for use during both, production tests and self-tests that are regularly performed during operation.

The example of FIG. 5 is essentially a combination of the previous examples of FIGS. 3 and 4. Accordingly, an analog multiplexer 16 is connected to the circuit nodes N1, N2, N3, and N4 of the base-band signal processing chain 13 to feed a selected one of the signals present at these circuit nodes through to the output of the analog multiplexer 16. In this regard, reference is made to FIG. 3 and the corresponding description to avoid unnecessary reiterations. In FIG. 5, the digital signal processing is the same as in the previous example of FIG. 4 and reference is made to the corresponding description above. Thus, the present example allows for both, the built-in self-test as described with reference to FIG. 4, as well as the EOL test using an external ATE as described with reference to FIG. 3.

Different form the previous examples, the plurality of oscillators 17a, 17b, 17c, 17d (see FIG. 3) is replaced by a single oscillator 17 and an analog demultiplexer 16'. The oscillator generates a test signal STEST, which is provided to the input of the analog demultiplexer 16', which directs the test signal to a selected one of the demultiplexer's outputs. The output selection is made based on the selection signal SEL' and is accomplished similarly to the input selection made in the analog multiplexer 16. Like the selection signal SEL explained above with reference to FIG. 3, the selection signal SEL' may be a two-bit binary signal. In the present example, the analog demultiplexer 16' has four outputs connected to the circuit nodes N1, N2, N3, and N4, respectively. Accordingly, the test signal $S_{TEST}$ generated by oscillator 17 is directed to one of the circuit nodes N1, N2, N3, and N4 dependent on the selection signal SEL'.

Figure 6:
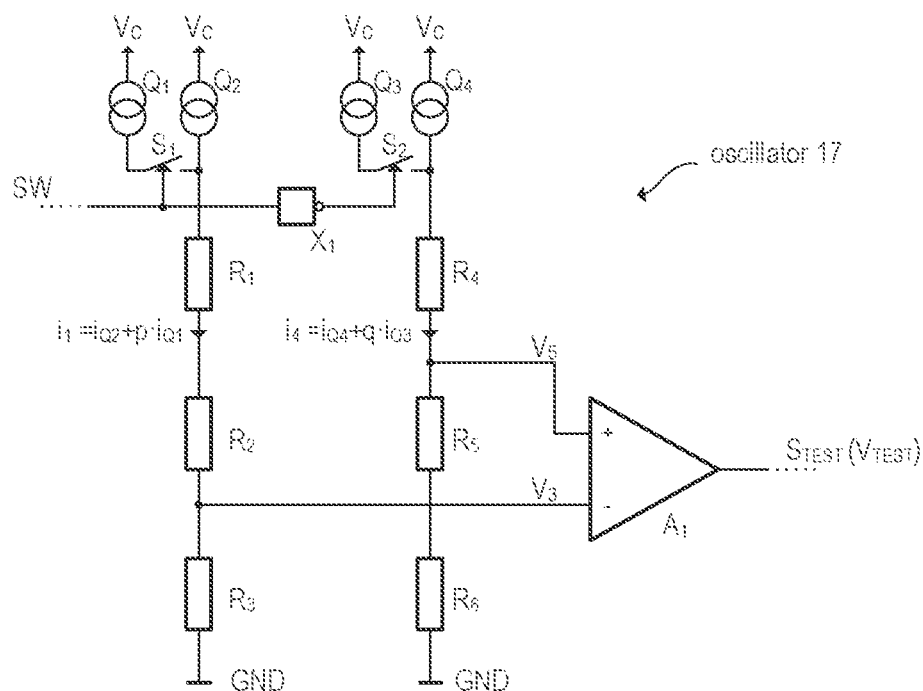
FIG. 6 is a circuit diagram illustrating one exemplary implementation of the oscillators used in the examples of FIGS. 3 to 5.

FIG. 6 is a circuit diagram illustrating a specific implementation of the oscillators 17 (see FIG. 5) or the oscillators 17*a-d* (see FIGS. 3 and 4). Accordingly, a first series circuit of resistors $R_1$, $R_2$ and $R_3$ and a second series circuit of resistors $R_4$, $R_5$ and $R_6$ are connected between ground and current source $Q_2$ and current source $Q_4$, respectively. Current source $Q_1$ (generating current $i_{Q1}$) can be connected in parallel to current source $Q_2$ (generating current $i_{Q2}$) via a first switch $S_1$ (a parallel circuit exists when the switch $S_1$ is closed). Current source $Q_3$ (generating current $i_{Q3}$) can be connected in parallel to current source $Q_4$ (generating current $i_{Q4}$) via a second switch $S_2$ (a parallel circuit exists when the switch $S_2$ is closed). The switches $S_1$ and $S_2$ are electronic switches and implemented, for example, as MOS transistors. Switch $S_1$ is switched on and off in accordance with the switching signal SW, and switch $S_2$ is switched on and off in accordance with an inverted version of the switching signal SW, which is generated by inverter $X_1$. The current passing through resistors $R_1$, $R_2$, and $R_3$ is denoted as $i_1$, and the current passing through resistors $R_4$, $R_5$, and $R_6$ is denoted as $i_4$. Current $i_1$ equals $i_{Q2}+p\ i_{Q1}$, wherein p is 0 or 1 according to the switching signal SW. Current $i_4$ equals $i_{Q4}+q\ i_{Q3}$, wherein q is the inverse of p (q=not p). The switching signal may be provided, for example, by a simple relaxation oscillator (RC oscillator). When an ATE is used in an EOL test (see FIG. 3), the switching signal SW may be derived from an external clock signal supplied to a chip pin and provided by the ATE.

Figure 7:
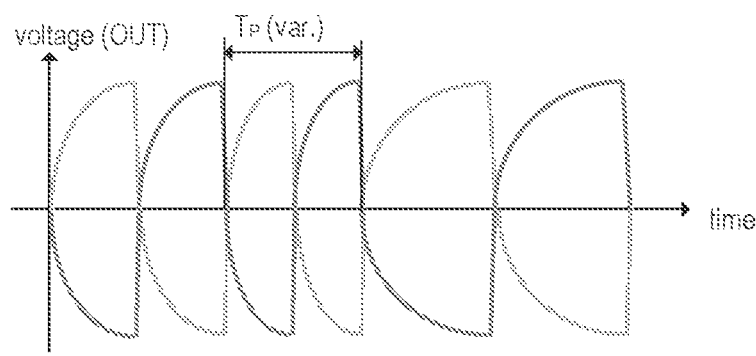
FIG. 7 is a timing diagram illustrating an exemplary waveform generated by the oscillator of FIG. 6.

The voltage $V_3$ across resistor $R_3$ equals $R3 \cdot (i_{Q2}+p \cdot i_{Q1})$ and the voltage $V_5$ across the series circuit of resistor $R_5$ and resistor $R_6$ equals $(R_5+R_6) \cdot (i_{Q4}+q \cdot i_{Q3})$. These voltages $V_3$ and $V_5$ are supplied to the amplifier $A_1$, which is configured to generate, as test signal $S_{TEST}$, an output voltage $V_{TEST}$ that equals $V_5$-$V_3$. FIG. 7 illustrates an exemplary waveform of the oscillator of FIG. 3. The rectangular signal does not have sharp edges due to parasitic capacitances in the circuit. The switching frequency is asynchronous to the sampling frequency of the ADC 14 to ensure that the fundamental frequency of the rectangular signal is not cancelled by convolution effected by the sampling. The varying frequency of the test signal may be achieved by varying the capacitance of capacitors included in the relaxation oscillator, which generates the switching signal. A varying capacitance may be achieved by connecting and disconnecting individual capacitors in the relaxation oscillator.

Figure 8:
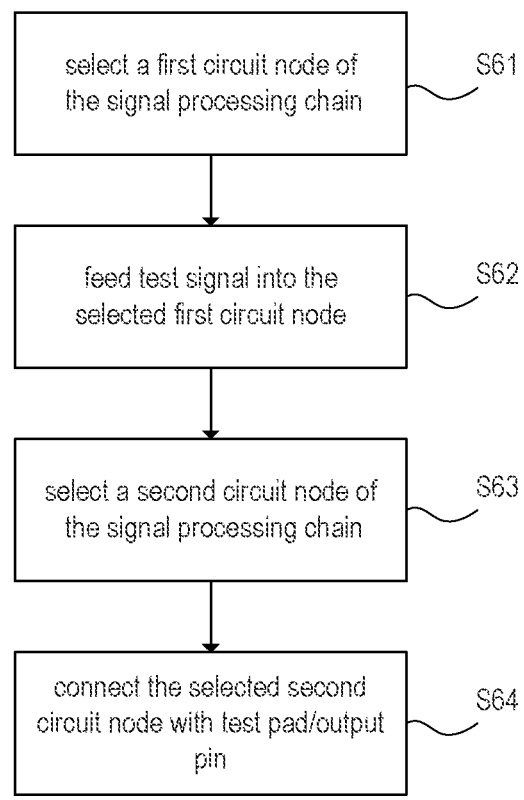
FIG. 8 is a flow chart illustrating one exemplary method for testing the receive path of an RF transceiver chip.

FIG. 8 is a flow chart illustrating one exemplary method for testing the receive path of an RF transceiver chip as illustrated, for example, in one of the FIGS. 3 to 5. Accordingly, the method includes the selection of a first circuit node of at least three circuit nodes (e.g. nodes N1, N2, N3) of the signal processing chain 13 (cf. FIGS. 3 to 5). The selection is made, based on a first selection signal (see FIG. 8, step S61), which is denoted as SEL' in the example of FIG. 5. The method further includes feeding a test signal into the selected first circuit node (see FIG. 8, step S62). A second circuit node of the at least three circuit nodes of the signal processing chain is selected (see FIG. 8, step S63). The selection may be done based on a second selection signal, which is denoted as SEL in the example of FIG. 5. The selected second circuit node is connected with a test pad or an output pin (cf. FIG. 5, output pin 18) of the RF receive circuit (see FIG. 8, step S64). Each one of the at least three circuit nodes (e.g. nodes N1, N2, N3) may be associated with a corresponding oscillator (see FIG. 4, oscillators 17*a*, 17*b*, 17*c*), wherein the oscillator that is associated with the selected first circuit node is activated to feed the test signal into the selected first circuit node. The remaining oscillators, which are not associated with the selected first circuit node, are deactivated or are left inactive.

In another exemplary embodiment, the method includes the configuration of a demultiplexer so that an oscillator (e.g. demultiplexer 16' and oscillator 15 of FIG. 5) is connected with the selected first circuit node. The configuration is made based on the first selection signal (see FIG. 5, selection signal SEL'). In various embodiments the method includes the configuration of a multiplexer so that the selected second circuit node is connected to the test pad or the output pin. The configuration is made based on the second selection signal (see FIGS. 3 and 5, multiplexer 16, selection signal SEL).

In one or more embodiments the output signal may be tapped at the mentioned test pad or the output pin, and a spectral analysis of the output signal may be performed to obtain a spectral representation of the output signal. In one embodiment, the spectral representation of the output signal may be compared with a stored reference (see FIG. 5, memory 152, functional block 153). The spectral analysis and the comparison may be done internally by a digital signal processor (see FIG. 5, DSP 15) or externally using automatic test equipment (ATE). An example for the latter case is illustrated in FIG. 3, in which the ATE 30 is connected to the test pad/output pin 18 of the circuit via a needle probe 31.

When using an ATE, the system for testing the RF receive circuit includes the ATE and the device under test (DUT), i.e. the chip including the RF receive circuit. During the test, the ATE is coupled to the DUT and controls its operation. Accordingly, the ATE may be configured to cause the oscillator circuit included in the DUT to feed the oscillator signal into a selected one of the circuit nodes (see FIGS. 3 to 5, circuit nodes N1, N2, N3, N4, selection signal SEL') of the signal processing chain. In one embodiment the ATE may be configured to cause the multiplexer included in the DUT to connect a selected one of the circuit nodes (see FIGS. 3 to 5, circuit nodes N1, N2, N3, N4, selection signal SEL) with the test pad or the output pin.

Moreover, a radar sensor is described herein, which may include, in accordance with one embodiment, at least one antenna (see, e.g. FIG. 2, antenna 20) providing an RF antenna signal, an RF receive circuit coupled to the at least one antenna, and a digital signal processor (e.g. FIG. 5, DSP 15) receiving a digital output signal (e.g. FIG. 5, signal $S_{RXDIG}$). The RF receive circuit may be implemented in accordance with one of the examples described herein. Accordingly, it may include a mixer 12 that is configured to receive an RF input signal SRX', which represents the RF antenna signal, and configured to down-convert the RF input signal into a base-band or intermediate frequency (IF) band (e.g. base-band signal $S_{BB}$). The RF receive circuit may further include an ADC 14 providing the digital output signal $S_{RXDIG}$, and a signal processing chain 13 coupled between the mixer 12 and the ADC 14. The signal processing chain 13 may include at least two circuit nodes (e.g. nodes N2 and N3). Further, the RF receive circuit includes an oscillator circuit (e.g. including one or more oscillators)

that is configured to generate a test signal STEST, coupled to the signal processing chain 13, and configured to selectively feed the test signal STEST into one of the at least two circuit nodes. During a self-test of the radar sensor, the DSP 15 is configured to select a circuit node (e.g. circuit node N2) of the least two circuit nodes, thus causing the oscillator circuit to feed the test signal into the selected circuit node (e.g. circuit node N2) and further causing the ADC 14 to generate the digital output signal SRXDIG in response to the test signal STEST. Further, the DSP is configured to perform a spectral analysis of the digital output signal SRXDIG to obtain a digital spectral representation of the digital output signal. The digital spectral representation may be compared to a reference in order to assess whether the radar sensor is functioning properly. If not, an error signal may be generated and communicated to a superordinate control unit.

Although the invention has been illustrated and described with respect to one or more implementations, alterations and/or modifications may be made to the illustrated examples without departing from the spirit and scope of the appended claims. In particular regard to the various functions performed by the above described components or structures (units, assemblies, devices, circuits, systems, etc.), the terms (including a reference to a "means") used to describe such components are intended to correspond—unless otherwise indicated—to any component or structure, which performs the specified function of the described component (e.g., that is functionally equivalent), even though not structurally equivalent to the disclosed structure, which performs the function in the herein illustrated exemplary implementations of the invention.

In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A radio frequency (RF) receive circuit that comprises:
a mixer configured to receive an RF input signal and to down-convert the RF input signal into a base-band or an intermediate frequency (IF) band;
an analog-to-digital converter (ADC);
a signal processing chain coupled between the mixer and the ADC, the signal processing chain including at least two circuit nodes; and
an oscillator circuit configured to generate a test signal, wherein the oscillator circuit is selectively coupled to the at least two circuit nodes of the signal processing chain and configured to selectively feed the test signal into one of the at least two circuit nodes.

2. The RF receive circuit of claim 1, wherein:
the signal processing chain includes a first circuit component and at least a second circuit component,
the at least two circuit nodes of the signal processing chain include one intermediate circuit node connecting the first circuit component and the second circuit component, and
the oscillator circuit is configured to selectively feed, dependent on a first selection signal the test signal into a selected one of the at least two circuit nodes.

3. The RF receive circuit of claim 2, wherein:
the oscillator circuit includes a first oscillator and a second oscillator, which are coupled to two different circuit nodes of the at least two circuit nodes and which are configured to be selectively disabled and enabled in accordance with the first selection signal.

4. The RF receive circuit of claim 2, wherein:
the oscillator circuit includes an oscillator, which is configured to generate the test signal, and a demultiplexer, which is configured to selectively direct, dependent on the first selection signal, the test signal to one of the at least two circuit nodes of the signal processing chain.

5. The RF receive circuit of claim 2, further comprising:
an analog multiplexer coupled to the signal processing chain and configured to selectively connect, dependent on a second selection signal, one of the at least two circuit nodes with a test pad or an output pin of the RF receive circuit.

6. The RF receive circuit of claim 1, wherein:
the mixer, the signal processing chain, the ADC and the oscillator circuit are integrated in one chip package.

7. The RF receive circuit of claim 1, wherein:
the oscillator circuit is configured to vary a fundamental frequency of the test signal.

8. A radio frequency (RF) receive circuit that comprises:
a mixer configured to receive an RF input signal and to down-convert the RF input signal into a base-band or an intermediate frequency (IF) band;
an analog-to-digital converter (ADC);
a signal processing chain coupled between the mixer and the ADC, the signal processing chain including at least two circuit nodes;
a digital signal processing circuit connected to the ADC downstream thereof; and
an oscillator circuit configured to generate a test signal, wherein the oscillator circuit is coupled to the signal processing chain and configured to selectively feed the test signal into one of the at least two circuit nodes,
the ADC is configured to generate a digital signal by digitizing an output signal of the signal processing chain, the output signal being derived from the test signal, and
the digital signal processing circuit is configured to perform a spectral analysis on frequency values of the digital signal.

9. The RF receive circuit of any of claim 8, wherein:
the digital signal processing circuit is configured to provide a spectral representation of the digital signal and to compare the spectral representation with a stored reference.

10. A method for testing a radio frequency (RF) receive circuit that includes signal processing chain coupled between a mixer and an analog-to-digital converter (ADC), the method comprising:
selecting, based on a first selection signal, a first circuit node from among at least three selectable circuit nodes of the signal processing chain;
feeding a test signal into the selected first circuit node;
selecting, based on a second selection signal, a second circuit node of the at least three selectable circuit nodes of the signal processing chain;
connecting the selected second circuit node with a test pad or an output pin of the RF receive circuit.

11. The method of claim 10, wherein:
each one of the at least three circuit nodes is associated with a corresponding oscillator, and
feeding the test signal into the selected first circuit node comprises activating the oscillator associated with the selected first circuit node.

12. The method of claim 11, wherein feeding a test signal into the selected first circuit node further comprises:
deactivating or leaving deactivated the oscillators not associated with the selected first circuit node.

13. The method of claim 10, wherein selecting the first circuit node comprises:
configuring, based on the first selection signal, a demultiplexer so that an oscillator is connected with the selected first circuit node.

14. The method of claim 10, wherein selecting the second circuit node comprises:
configuring, based on the second selection signal, a multiplexer so that the selected second circuit node is connected to the test pad or the output pin.

15. The method of claim 10, further comprising:
tapping an output signal at the test pad or the output pin;
performing a spectral analysis of the output signal to obtain a spectral representation of the output signal.

16. The method of claim 15, further comprising:
comparing the spectral representation of the output signal with a stored reference.

17. The method of claim 15, wherein the output signal is tapped at the test pad or the output pin by automatic test equipment (ATE), which is external to and separate from the RF receive circuit.

18. The method of claim 15, wherein:
the RF receive circuit is included in a radar sensor device,
the output signal is digitized by the ADC included in the radar sensor device, and
the spectral analysis is performed by a digital signal processor included in the radar sensor device.

19. A system for testing a radio frequency (RF) receive circuit, the system comprising:
automatic test equipment (ATE); and
the RF receive circuit coupled to the ATE during a test;
wherein the RF receive circuit comprises:
a mixer configured to receive an RF input signal to down-convert the RF input signal into a base-band or intermediate frequency (IF) band;
an analog-to-digital converter (ADC);
a signal processing chain coupled between the mixer and the ADC, the signal processing chain including at least two circuit nodes; and
an oscillator circuit configured to generate a test signal, wherein the oscillator circuit is selectively coupled to the at least two circuit nodes of the signal processing chain and configured to selectively feed the test signal into one of the at least two circuit nodes;
wherein the ATE is configured to cause the oscillator circuit to feed the test signal into a selected one of the at least two circuit nodes.

20. The system of claim 19, wherein:
the RF receive circuit further comprises an analog multiplexer coupled to the signal processing chain and configured to selectively connect one of the at least two circuit nodes with a test pad or an output pin of the RF receive circuit, and
the ATE is configured to cause the multiplexer to connect a selected one of the at least two circuit nodes with the test pad or the output pin.

21. The system of claim 20, wherein the ATE is configured to perform a spectral analysis of an output signal tapped at the test pad or the output pin.

22. A radar sensor comprising:
at least one antenna providing an RF antenna signal;
a radio frequency (RF) receive circuit coupled to the at least one antenna; and
a digital signal processor receiving a digital output signal;
wherein the RF receive circuit includes:
a mixer configured to receive an RF input signal, which represents the RF antenna signal, and to down-convert the RF input signal into a base-band or intermediate frequency (IF) band;
an analog-to-digital converter (ADC) providing the digital output signal;
a signal processing chain coupled between the mixer and the ADC, the signal processing chain including at least two circuit nodes; and
an oscillator circuit configured to generate a test signal, coupled to the signal processing chain, and configured to selectively feed the test signal into one of the at least two circuit nodes,
wherein, during a self-test of the radar sensor, the digital signal processor is configured to:
select a circuit node of the least two circuit nodes, wherein the oscillator circuit is configured to feed the test signal into the selected circuit node and the ADC is configured to generate the digital output signal in response to the test signal; and
perform a spectral analysis of the output signal to generate a digital spectral representation of the digital output signal.

* * * * *